(12) United States Patent
Ito et al.

(10) Patent No.: US 10,826,461 B2
(45) Date of Patent: Nov. 3, 2020

(54) ACOUSTIC WAVE DEVICE

(71) Applicant: TAIYO YUDEN CO., LTD., Tokyo (JP)

(72) Inventors: Kohei Ito, Tokyo (JP); Osamu Kawachi, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 722 days.

(21) Appl. No.: 15/623,311

(22) Filed: Jun. 14, 2017

(65) Prior Publication Data

US 2018/0013400 A1     Jan. 11, 2018

(30) Foreign Application Priority Data

Jul. 5, 2016 (JP) ................. 2016-133682

(51) Int. Cl.
| | |
|---|---|
| *H03H 9/25* | (2006.01) |
| *H03H 9/145* | (2006.01) |
| *H03H 9/02* | (2006.01) |
| *H03H 9/64* | (2006.01) |

(52) U.S. Cl.
CPC .... *H03H 9/14502* (2013.01); *H03H 9/02559* (2013.01); *H03H 9/02637* (2013.01); *H03H 9/25* (2013.01); *H03H 9/64* (2013.01)

(58) Field of Classification Search
CPC ........... H03H 9/14502; H03H 9/02559; H03H 9/02637; H03H 9/25; H03H 9/64
USPC ...................... 310/313 A–313 D, 313 R, 340
See application file for complete search history.

(56) References Cited

U.S. PATENT DOCUMENTS

| | | | |
|---|---|---|---|
| 2004/0140734 A1 | 7/2004 | Nakao et al. | |
| 2012/0038244 A1 | 2/2012 | Wada et al. | |
| 2012/0313483 A1* | 12/2012 | Matsuda | ............ H03H 9/02866 |
| | | | 310/313 C |

FOREIGN PATENT DOCUMENTS

| | | | |
|---|---|---|---|
| JP | H2-295211 A | 12/1990 | |
| JP | H4-239213 A | 8/1992 | |
| JP | 2004-228689 A | 8/2004 | |
| JP | 2012-65304 | 3/2012 | |
| JP | 2012-75026 A | 4/2012 | |
| JP | 2015-167272 A * | 9/2015 | ............. H03H 9/145 |
| JP | 2015-167272 A | 9/2015 | |

OTHER PUBLICATIONS

Japanese Office Action dated Dec. 4, 2018, in a counterpart Japanese patent application No. 2016-133682. (A machine translation (not reviewed for accuracy) attached.).

* cited by examiner

*Primary Examiner* — Thomas M Dougherty
(74) *Attorney, Agent, or Firm* — Chen Yoshimura LLP

(57) ABSTRACT

An acoustic wave device includes: a piezoelectric substrate; a comb-shaped electrode located on the piezoelectric substrate; a pair of reflectors located on the piezoelectric substrate, the pair of reflectors sandwiching the comb-shaped electrode; a first dielectric film located on the piezoelectric substrate, the first dielectric film covering the pair of reflectors and having side surfaces in regions between the comb-shaped electrode and the pair of reflectors; and a second dielectric film located on the piezoelectric substrate, the second dielectric film covering the comb-shaped electrode and being in contact with the side surfaces of the first dielectric film.

9 Claims, 14 Drawing Sheets

ACOUSTIC WAVE DEVICE

CROSS-REFERENCE TO RELATED APPLICATION

This application is based upon and claims the benefit of priority of the prior Japanese Patent Application No. 2016-133682, filed on Jul. 5, 2016, the entire contents of which are incorporated herein by reference.

FIELD

A certain aspect of the present invention relates to an acoustic wave device.

BACKGROUND

There has been known an end face reflection type one-port resonator including an Interdigital Transducer (IDT) having a pair of comb-shaped electrodes formed on a piezoelectric substrate and reflecting an acoustic wave by stepped end faces located on the upper surface of the piezoelectric substrate as disclosed in, for example, Japanese Patent Application Publication No. 2004-228689. There has been also known a one-port resonator with a reflector in which a pair of reflectors sandwiching the IDT is located on the piezoelectric substrate and the IDT and the reflectors are covered with an insulating film as disclosed in, for example, Japanese Patent Application Publication No. 2015-167272.

Since the acoustic wave devices are used for mobile communication devices such as mobile phones, reducing its size has been desired.

SUMMARY OF THE INVENTION

According to a first aspect of the present invention, there is provided an acoustic wave device including: a piezoelectric substrate; a comb-shaped electrode located on the piezoelectric substrate; a pair of reflectors located on the piezoelectric substrate, the pair of reflectors sandwiching the comb-shaped electrode; a first dielectric film located on the piezoelectric substrate, the first dielectric film covering the pair of reflectors and having side surfaces in regions between the comb-shaped electrode and the pair of reflectors; and a second dielectric film located on the piezoelectric substrate, the second dielectric film covering the comb-shaped electrode and being in contact with the side surfaces of the first dielectric film.

According to a second aspect of the present invention, there is provided an acoustic wave device including: a piezoelectric substrate; a comb-shaped electrode located on the piezoelectric substrate; a pair of reflectors located on the piezoelectric substrate, the pair of reflectors sandwiching the comb-shaped electrode; and a dielectric film located on the piezoelectric substrate, the dielectric film covering the comb-shaped electrode and the pair of reflectors, a thickness of the dielectric film on the pair of reflectors being greater than the thickness of the dielectric film on the comb-shaped electrode, the dielectric film having side surfaces substantially perpendicular to an arrangement direction of electrode fingers of the comb-shaped electrode in regions between the comb-shaped electrode and the pair of reflectors.

DETAILED DESCRIPTION

Hereinafter, a description will be given of embodiments of the present invention with reference to the accompanying drawings.

First Embodiment

Figure 1A:
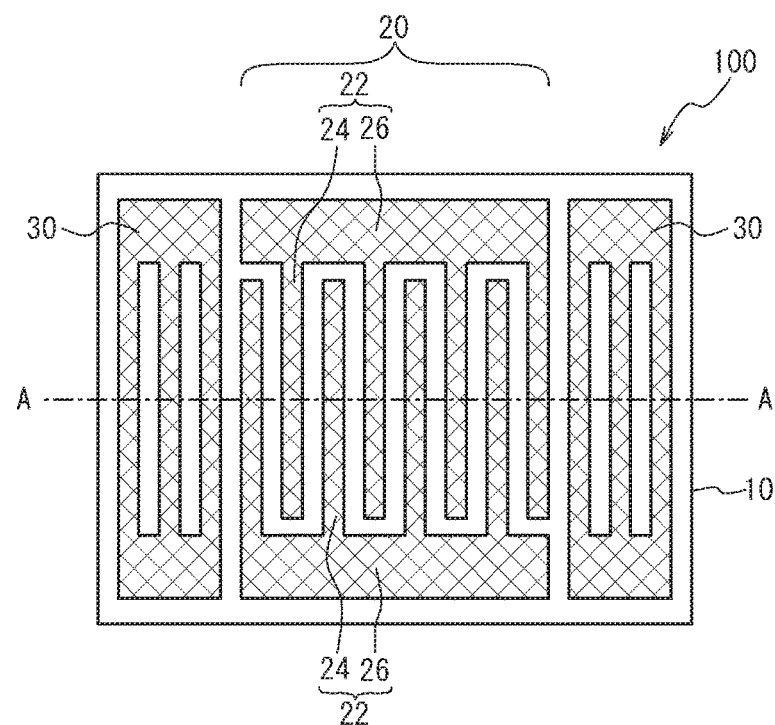
FIG. 1A is a plan view of an acoustic wave resonator in accordance with a first embodiment.
Figure 1B:
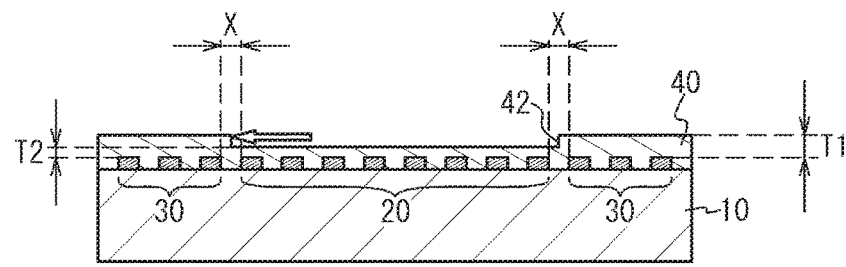
FIG. 1B is a cross-sectional view taken along line A-A in FIG. 1A.

FIG. 1A is a plan view of an acoustic wave resonator in accordance with a first embodiment, and FIG. 1B is a cross-sectional view taken along line A-A in FIG. 1A. As illustrated in FIG. 1A and FIG. 1B, an acoustic wave resonator 100 of the first embodiment includes an Interdigital Transducer (IDT) 20 including a pair of comb-shaped electrodes 22 and a pair of reflectors 30 sandwiching the IDT 20 on a piezoelectric substrate 10. The piezoelectric substrate 10 is, for example, a lithium tantalate substrate or a lithium niobate substrate. The IDT 20 and the reflectors 30 are formed of a metal film made of, for example, aluminum, copper, or aluminum to which copper is added.

The comb-shaped electrode 22 includes electrode fingers 24 and a bus bar 26 to which the electrode fingers 24 are coupled. The pair of comb-shaped electrodes 22 are arranged so as to face each other so that the electrode fingers 24 of one of the comb-shaped electrodes 22 are substantially alternated with the electrode fingers 24 of the other of the comb-shaped electrodes 22. The acoustic wave excited by the electrode fingers 24 mainly propagates in the arrangement direction of the electrode finger 24. The pair of reflectors 30 are located so as to sandwich the IDT 20 in the propagation direction of the acoustic wave, and reflect the acoustic wave. The pitch of the electrode fingers 24 substantially corresponds to the wavelength of the acoustic wave.

Located on the piezoelectric substrate 10 is a dielectric film 40 having a film thickness greater than those of the IDT 20 and the reflectors 30 and covering the IDT 20 and the reflectors 30. A thickness T1 of the dielectric film 40 on the reflector 30 is greater than a thickness T2 of the dielectric film 40 on the IDT 20. The thickness T1 of the dielectric film 40 on the reflector 30 is, for example, approximately 40 nm or greater. The thickness T2 of the dielectric film 40 on the IDT 20 is, for example, approximately 10 to 30 nm.

The dielectric film 40 has side surfaces 42 substantially perpendicular to the upper surface of the piezoelectric substrate 10 and the arrangement direction of the electrode fingers 24 in regions X between the IDT 20 and the pair of reflectors 30. The regions X include the end faces closest to the IDT 20 of the pair of reflectors 30 and the end faces closest to the reflectors 30 of the IDT 20. The term "substantially perpendicular" is not limited to "meet at 90°", and includes, for example, "meet at 80° to 100°". The dielectric film 40 is, for example, a silicon oxide film ($SiO_2$ film), a silicon nitride film (SiN film), a fluorine-added silicon oxide film (SiOF film), or an aluminum oxide film ($Al_2O_3$ film). The dielectric film 40 has a function as a protective film that reduces the penetration of water into the IDT 20 and the reflectors 30, and thereby inhibits the corrosion of the IDT 20 and the reflectors 30.

Figure 2A:
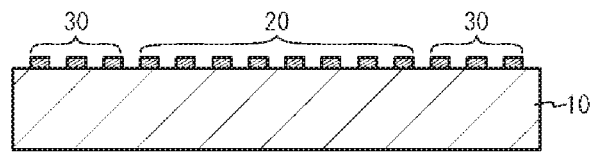
FIG. 2A through FIG. 2E are cross-sectional views illustrating a method of fabricating the acoustic wave resonator in accordance with the first embodiment.

FIG. 2A through FIG. 2E are cross-sectional views illustrating a method of fabricating the acoustic wave resonator in accordance with the first embodiment. As illustrated in FIG. 2A, a metal film is deposited on the piezoelectric substrate 10, and the metal film is then patterned into a desired shape. This process forms the IDT 20 and the pair of reflectors 30 on the piezoelectric substrate 10. The metal film can be deposited by, for example, sputtering, vacuum evaporation, or Chemical Vapor Deposition (CVD). The metal film can be patterned by, for example, photolithography and etching.

Figure 2B:

As illustrated in FIG. 2B, the dielectric film 40 with a film thickness greater than those of the IDT 20 and the reflectors 30 is deposited on the piezoelectric substrate 10. This process causes the IDT 20 and the pair of reflectors 30 to be covered with the dielectric film 40. The dielectric film 40 can be deposited by, for example, sputtering, vacuum evaporation, or CVD.

Figure 2C:
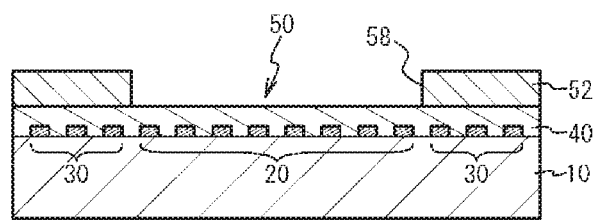

As illustrated in FIG. 2C, formed on the dielectric film 40 is a mask layer 52 covering the pair of reflectors 30, having an aperture 50 above the IDT 20, and having side surfaces 58 substantially perpendicular to the upper surface of the piezoelectric substrate 10 and the arrangement direction of the electrode fingers 24. The side surfaces 58 of the mask layer 52 are located between the IDT 20 and the pair of reflectors 30. The mask layer 52 is formed of, for example, a resist film.

Figure 2D:
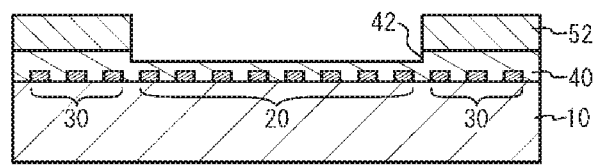

As illustrated in FIG. 2D, a recessed portion is formed in the dielectric film 40 by anisotropic etching the dielectric film 40 exposed by the aperture 50 by using the mask layer 52 as a mask. The recessed portion is formed from a region between one of the pair of reflectors 30 and the IDT 20 to a region between the other of the pair of reflectors 30 and the IDT 20. Thus, the thickness of the dielectric film 40 on the IDT 20 becomes less than the thickness of the dielectric film 40 on the pair of reflectors 30. The recessed portion formed by anisotropic etching has substantially vertical side surfaces. That is, in the dielectric film 40, the side surfaces 42 substantially perpendicular to the upper surface of the piezoelectric substrate 10 and the arrangement direction of the electrode fingers 24 are formed in the regions between the IDT 20 and the pair of reflectors 30. For example, when the dielectric film 40 formed of a silicon oxide film is etched by approximately 100 nm by using a resist formed at an angle of approximately 90°, the angles of the side surfaces 42 formed in the dielectric film 40 to the upper surface of the piezoelectric substrate 10 become approximately 90° which corresponds to the shape of the resist.

Figure 2E:
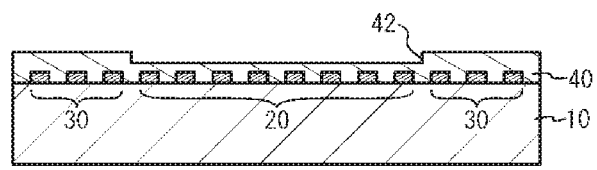

As illustrated in FIG. 2E, the mask layer 52 is removed. The above processes form the acoustic wave resonator 100 of the first embodiment.

Figure 3A:
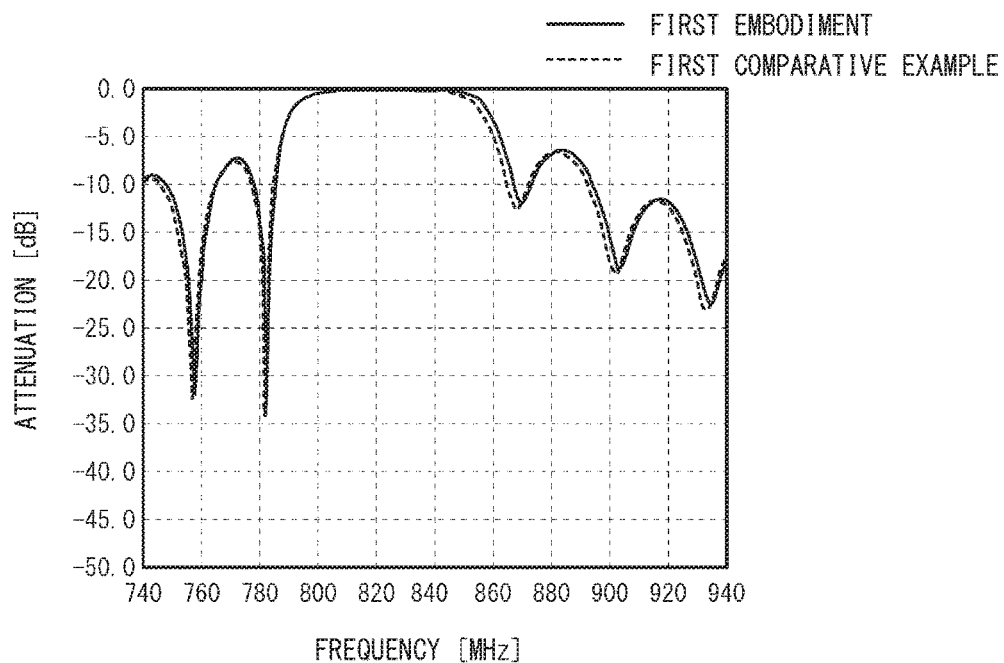
FIG. 3A and FIG. 3B illustrate simulation results of the frequency characteristics of the acoustic wave resonators in accordance with the first embodiment and a first comparative example.
Figure 3B:
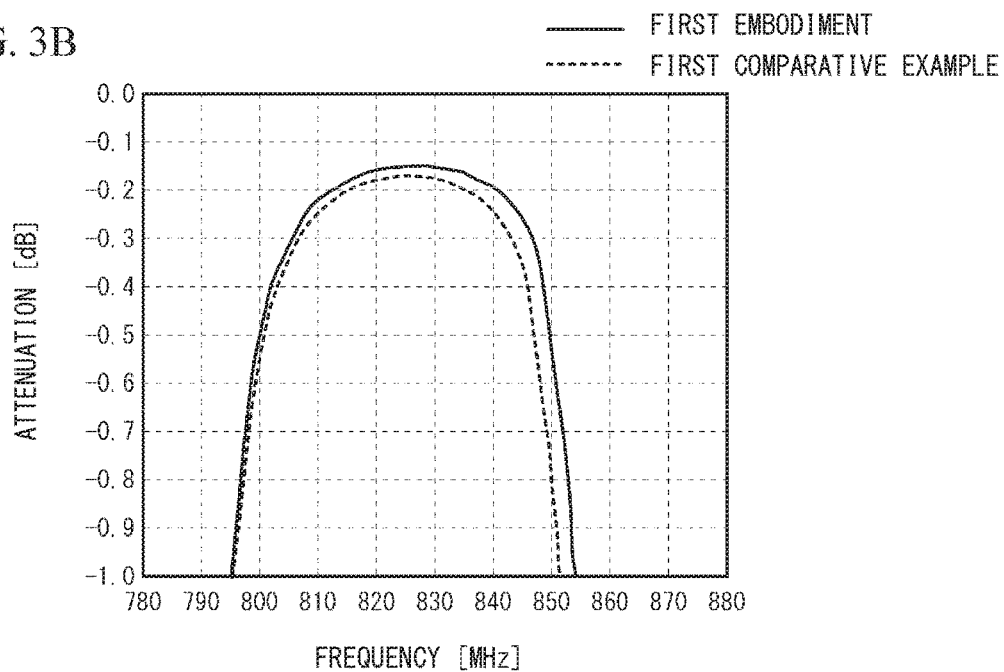

FIG. 3A and FIG. 3B illustrate simulation results of frequency characteristics of the acoustic wave resonators in accordance with the first embodiment and a first comparative example. FIG. 3B is an enlarged view around the passband of FIG. 3A. The simulated acoustic wave resonator of the first embodiment was assumed to have a structure in which the piezoelectric substrate 10 is a lithium tantalate substrate, the IDT 20 and the reflectors 30 are formed of a multilayered film made of titanium and aluminum and having a thickness of 380 nm, and the dielectric film 40 is a silicon oxide film. The number of pairs of the electrode fingers 24 in the IDT 20 was assumed to be 12.5 pairs, and the pitch interval was assumed to be 4.756 nm. The aperture length of the IDT 20 was assumed to be 488 μm. The pitch interval in the reflector 30 was assumed to be 4.874 nm. The thickness of the dielectric film 40 on the IDT 20 was assumed to be 15 nm, and the thickness of the dielectric film 40 on the reflector 30 was assumed to be 40 nm. The structure of the simulated acoustic wave resonator of the first comparative example was assumed to be the same as that of the acoustic wave resonator of the first embodiment except that the thickness of the dielectric film 40 on the IDT 20 and the reflector 30 was assumed to be constant and 15 nm, and the pitch interval in the reflector 30 was assumed to be 4.885 nm.

As illustrated in FIG. 3A and FIG. 3B, the acoustic wave resonator of the first embodiment has a broader passband and less insertion loss than the acoustic wave resonator of the first comparative example. The reason is considered as follows. That is, in the first embodiment, the thickness of the dielectric film 40 on the IDT 20 is made to be relatively thin to reduce the deterioration of the frequency characteristics while the thickness of the dielectric film 40 on the reflector 30 is made to be relatively thick. By making the dielectric film 40 on the reflector 30 thick, the propagation velocity of the acoustic wave propagating through the region where the reflector 30 is located becomes slow because of mass load effect. Thus, the reflection characteristics of the reflectors 30 are improved. In addition, the dielectric film 40 has the side surfaces 42 substantially perpendicular to the arrangement direction of the electrode fingers 24 in the regions X between the IDT 20 and the pair of reflectors 30. As indicated by the arrow in FIG. 1B, a part of the acoustic wave excited by the electrode finger 24 propagates inside the dielectric film 40, and is reflected by the side surfaces 42. Since the side surfaces 42 are substantially perpendicular to the arrangement direction of the electrode fingers 24, the side surfaces 42 efficiently reflect the acoustic wave. As a result, the reflection characteristics are further improved. It is considered that the improvement of the reflection characteristics broadens the passband and reduces the insertion loss.

Figure 4A:
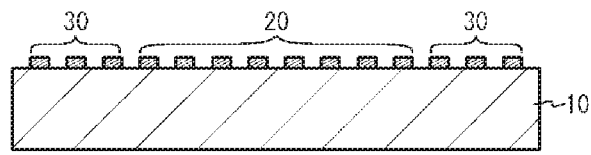
FIG. 4A through FIG. 4E are cross-sectional views illustrating a method of fabricating the acoustic wave resonator in accordance with a second comparative example.

FIG. 4A through FIG. 4E are cross-sectional views illustrating a method of fabricating an acoustic wave resonator in accordance with a second comparative example. As illustrated in FIG. 4A, the IDT 20 and the pair of reflectors 30 are formed on the piezoelectric substrate 10. The IDT 20 and the pair of reflectors 30 can be formed by the method described in FIG. 2A.

Figure 4B:
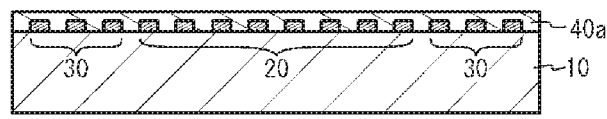

As illustrated in FIG. 4B, deposited on the piezoelectric substrate 10 is a dielectric film 40a with a film thickness greater than those of the IDT 20 and the pair of reflectors 30. The film thickness of the dielectric film 40a is approximately equal to the thickness of the dielectric film 40 left on the IDT 20 after the etching of the dielectric film 40 in FIG. 2D.

Figure 4C:
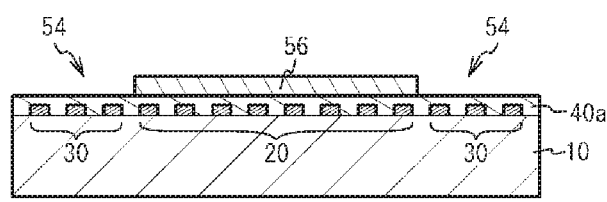

As illustrated in FIG. 4C, a mask layer 56 covering the IDT 20 and having apertures 54 above the pair of reflectors 30 is formed on the dielectric film 40a. The side surfaces of the mask layer 56 are located between the IDT 20 and the pair of reflectors 30. The mask layer 56 is formed of, for example, a resist film.

Figure 4D:
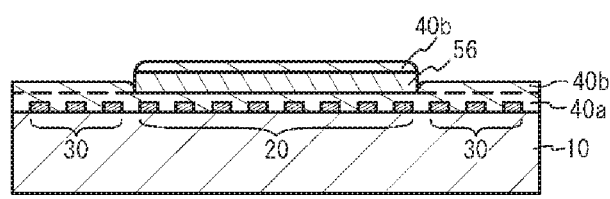

As illustrated in FIG. 4D, a dielectric film 40b is deposited on the dielectric film 40a exposed by the apertures 54 by using the mask layer 56 as a mask. The dielectric film 40b is made of the same material as the dielectric film 40a. The dielectric film 40b is deposited by, for example, vacuum evaporation or sputtering. The side surfaces of the dielectric film 40b become inclined to the upper surface of the piezoelectric substrate 10. This is for removing the mask layer 56 by liftoff as described in FIG. 4E. For example, when the dielectric film 40b formed of a silicon oxide film is deposited by vacuum evaporation, the angles of the side surfaces of the dielectric film 40b to the upper surface of the piezoelectric substrate 10 are affected by the incidence angle of evaporation atoms regardless of the thickness of the deposition. When the incidence angle of evaporation atoms is 90°, the angles of the side surfaces do not become 90° because the atoms are shielded by the mask.

Figure 4E:
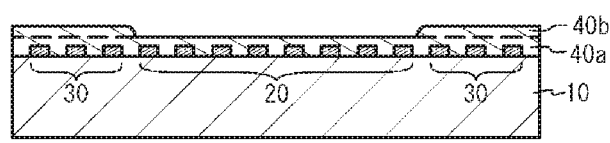

As illustrated in FIG. 4E, the dielectric film 40b deposited on the mask layer 56 is removed together with the mask layer 56 by liftoff. This processes forms the dielectric film 40a, which covers the IDT 20, on the IDT 20, and forms a multilayered film of the dielectric films 40a and 40b, which covers the reflectors 30, on the pair of reflectors 30. That is, the thickness of the dielectric film on the pair of reflectors 30 becomes thicker than the thickness of the dielectric film on the IDT 20.

In the second comparative example, the dielectric film 40b is additionally formed by liftoff so that the thickness of the dielectric film on the reflectors 30 is greater than the thickness of the dielectric film on the IDT 20. When the dielectric film 40b is formed by liftoff, to remove the mask layer 56, the side surfaces of the dielectric film 40b are inclined to the arrangement direction of the electrode fingers 24. Thus, the acoustic wave is hardly reflected by the side surfaces of the dielectric film 40b, resulting in the small degree of improvement of the reflection characteristics.

As described above, in the first embodiment, as illustrated in FIG. 1B, the dielectric film 40 covers the IDT 20 and the pair of reflectors 30. The thickness of the dielectric film 40 on the pair of reflectors 30 is greater than the thickness of the dielectric film 40 on the IDT 20, and the dielectric film 40 has the side surfaces 42 substantially perpendicular to the arrangement direction of the electrode fingers 24 in the regions X between the IDT 20 and the pair of reflectors 30. This structure improves the reflection characteristics as described above. Since the reflection characteristics improve, the number of pairs in the reflector 30 can be reduced and/or the pitch interval in the reflector 30 can be reduced. Thus, the reflectors 30 can be reduced in size. That is, the acoustic wave resonator can be reduced in size.

The angle of the side surface 42 of the dielectric film 40 to the arrangement direction of the electrode fingers 24 is preferably 80° to 100°, more preferably 85° to 95°, further preferably 88° to 92° to efficiently reflect the acoustic wave.

Second Embodiment

Figure 5A:
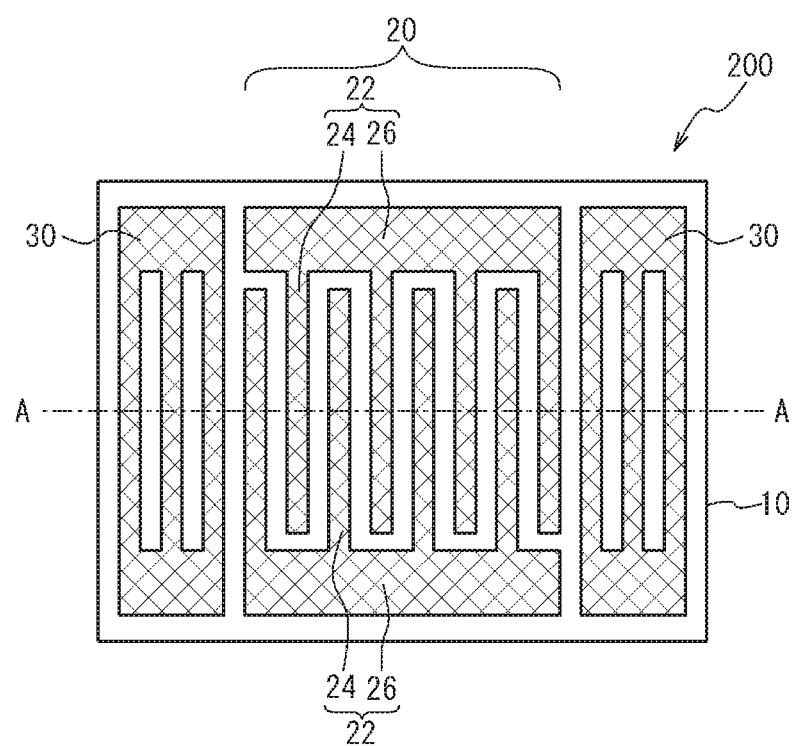
FIG. 5A is a plan view of an acoustic wave resonator in accordance with a second embodiment.
Figure 5B:
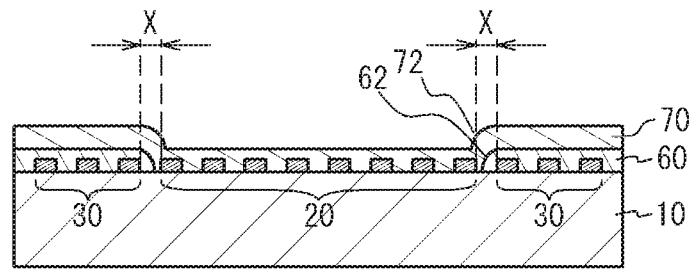
FIG. 5B is a cross-sectional view taken along line A-A in FIG. 5A.

FIG. 5A is a plan view of an acoustic wave resonator in accordance with a second embodiment, and FIG. 5B is a cross-sectional view taken along line A-A in FIG. 5A. As illustrated in FIG. 5A and FIG. 5B, an acoustic wave resonator 200 of the second embodiment includes dielectric films 60 and 70 instead of the dielectric film 40. The dielectric films 60 have a film thickness greater than those of the IDT 20 and the reflectors 30, and cover the pair of reflectors 30. The dielectric film 60 does not cover the IDT 20. Side surfaces 62 of the dielectric films 60 are located in the regions X between the IDT 20 and the pair of reflectors 30. The dielectric film 70 has a film thickness greater than those of the IDT 20 and the reflectors 30, and covers the dielectric films 60 and the IDT 20. The dielectric film 70 is in contact with the side surfaces 62 of the dielectric films 60. The dielectric film 60 is, for example, an $Al_2O_3$ film, a tantalum oxide film ($Ta_2O_X$), a glass, a tellurium oxide film ($TeO_X$), a niobium oxide film ($Nb_2O_X$), or a SiN film. The dielectric film 70 is, for example, a $SiO_2$ film or a SiOF film. The dielectric film 60 and the dielectric film 70 have different acoustic impedance. For example, the acoustic impedance of the dielectric film 60 is higher than the acoustic impedance of the dielectric film 70. Other structures are the same as those of the first embodiment, and the description thereof is thus omitted.

Figure 6A:
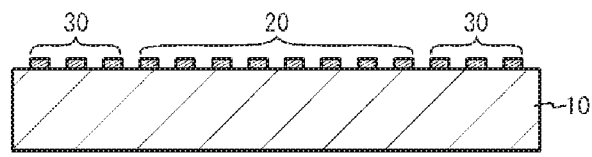
FIG. 6A through FIG. 6E are cross-sectional views illustrating a method of fabricating the acoustic wave resonator in accordance with the second embodiment.

FIG. 6A through FIG. 6E are cross-sectional views illustrating a method of fabricating the acoustic wave resonator in accordance with the second embodiment. As illustrated in FIG. 6A, the IDT 20 and the pair of reflectors 30 are formed on the piezoelectric substrate 10. The IDT 20 and the pair of reflectors 30 can be formed by the method described in FIG. 2A.

Figure 6B:
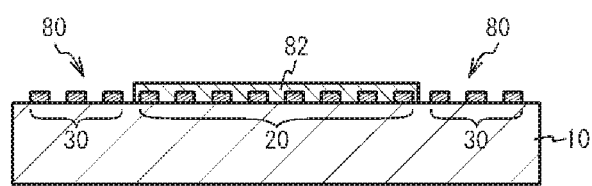

As illustrated in FIG. 6B, formed on the piezoelectric substrate 10 is a mask layer 82 covering the IDT 20 and having apertures 80 above the pair of reflectors 30. The side surfaces of the mask layer 82 are located between the IDT 20 and the pair of reflectors 30. The mask layer 82 is formed of, for example, a resist film.

Figure 6C:
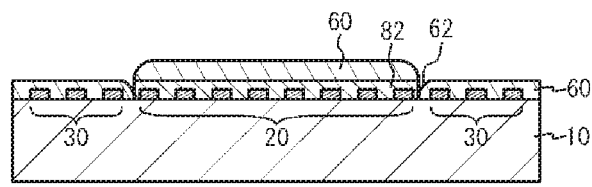

As illustrated in FIG. 6C, the dielectric film 60 covering the pair of reflectors 30 is deposited on the piezoelectric substrate 10 exposed by the apertures 80 by using the mask layer 82 as a mask. The dielectric film 60 is formed by, for example, vacuum evaporation or sputtering. This process forms the dielectric film 60 having the side surfaces 62 in the regions between the IDT 20 and the pair of reflectors 30. The side surfaces 62 of the dielectric film 60 are inclined to the upper surface of the piezoelectric substrate 10 to remove the mask layer 82 by liftoff.

Figure 6D:
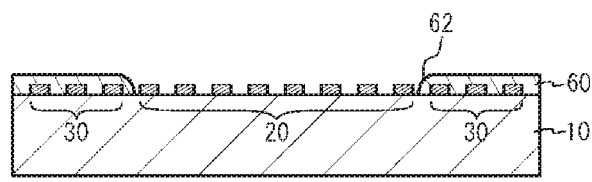

As illustrated in FIG. 6D, the dielectric film 60 deposited on the mask layer 82 is removed together with the mask layer 82 by liftoff.

Figure 6E:
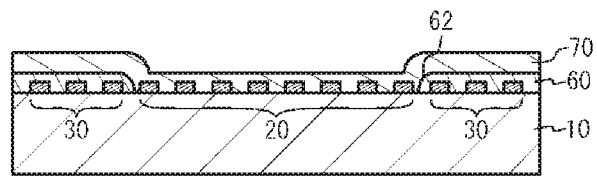

As illustrated in FIG. 6E, the dielectric film 70 with a film thickness greater than those of the IDT 20 and the reflectors 30 is deposited on the piezoelectric substrate 10. This process allows the dielectric film 70 to be in contact with the side surfaces 62 of the dielectric film 60 and cover the IDT 20 and the dielectric film 60. The above described processes form the acoustic wave resonator 200 of the second embodiment.

In the second embodiment, as illustrated in FIG. 5B, the dielectric film 60 covering the pair of reflectors 30 and having the side surfaces 62 in the regions X between the IDT 20 and the pair of reflectors 30 is provided. The IDT 20 is covered with the dielectric film 70 being in contact with the side surfaces 62 of the dielectric films 60. Since the side surfaces 62 of the dielectric films 60 are located near the upper surface of the piezoelectric substrate 10 (for example, are in direct contact with the upper surface of the piezoelectric substrate 10), the side surfaces 62 of the dielectric films 60 efficiently reflect the acoustic wave excited by the electrode fingers 24, improving the reflection characteristics. Thus, the reflector 30 can be reduced in size, and thereby, the acoustic wave resonator can be reduced in size.

In addition, in the second embodiment, as illustrated in FIG. 5B, the dielectric film 70 covers the IDT 20 and the dielectric film 60. The sum of the thicknesses of the dielectric film 60 and the dielectric film 70 on the reflector 30 is greater than the thickness of the dielectric film 60 on the IDT 20. This structure reduces the deterioration of the frequency characteristics and improves the reflection characteristics of the reflector 30 because of mass load effect.

In addition, in the second embodiment, as illustrated in FIG. 5B, the dielectric film 70 has side surfaces 72 in the regions X between the IDT 20 and the pair of reflectors 30. This structure improves the reflection efficiency of the acoustic wave excited by the electrode fingers 24.

In addition, in the second embodiment, the dielectric film 60 and the dielectric film 70 are made of different materials. This structure allows the acoustic impedance of the dielectric film 60 and the acoustic impedance of the dielectric film 70 to differ from each other. Thus, the acoustic wave excited by the electrode fingers 24 is efficiently reflected by the side surfaces 62 of the dielectric films 60. To improve the reflection efficiency of the acoustic wave by the side surfaces 62 of the dielectric films 60, the acoustic impedance of the dielectric film 60 is preferably higher than the acoustic impedance of the dielectric film 70.

Third Embodiment

Figure 7A:
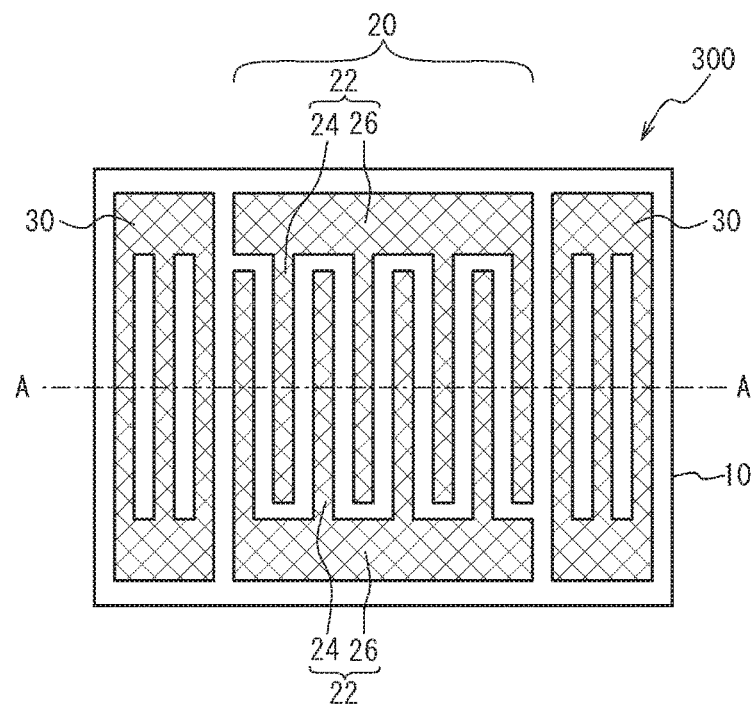
FIG. 7A is a plan view of an acoustic wave resonator in accordance with a third embodiment.
Figure 7B:
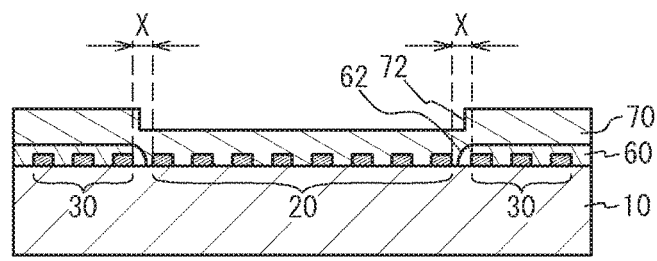
FIG. 7B is a cross-sectional view taken along line A-A in FIG. 7A.

FIG. 7A is a plan view of an acoustic wave resonator in accordance with a third embodiment, and FIG. 7B is a cross-sectional view taken along line A-A in FIG. 7A. As illustrated in FIG. 7A and FIG. 7B, in an acoustic wave resonator 300 of the third embodiment, the side surfaces 72 of the dielectric film 70 is located in the regions X between the IDT 20 and the pair of reflectors 30, and are substantially perpendicular to the upper surface of the piezoelectric substrate 10 and the arrangement direction of the electrode fingers 24. The side surfaces 72 of the dielectric film 70 are located at positions at which the side surfaces 72 overlap with the side surfaces 62 of the dielectric films 60 in the direction perpendicular to the upper surface of the piezoelectric substrate 10. Other structures are the same as those of the second embodiment, and the description thereof is thus omitted.

In the third embodiment, the dielectric film 70 has the side surfaces 72 substantially perpendicular to the arrangement direction of the electrode fingers 24 in the regions X between the IDT 20 and the pair of reflectors 30. This structure allows the acoustic wave excited by the electrode fingers 24 to be efficiently reflected.

Figure 8A:
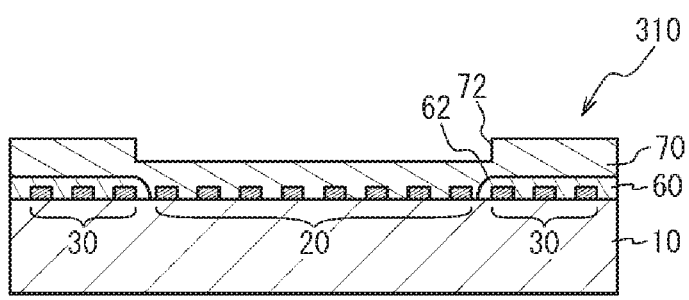
FIG. 8A and FIG. 8B are cross-sectional views of acoustic wave resonators in accordance with first and second variations of the third embodiment.
Figure 8B:
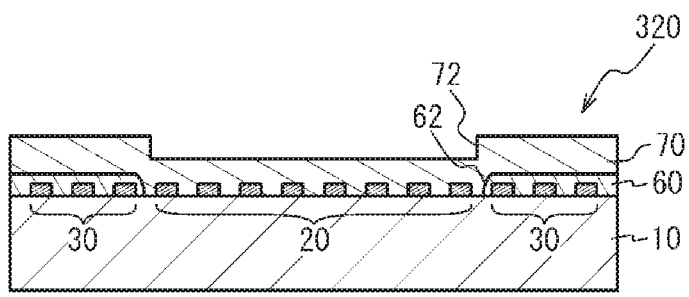

FIG. 8A and FIG. 8B are cross-sectional views of acoustic wave resonators in accordance with first and second variations of the third embodiment, respectively. As in an acoustic wave resonator 310 of the first variation of the third embodiment in FIG. 8A, the side surfaces 72 of the dielectric film 70 may be in plane with the end faces closest to the IDT 20 of the reflectors 30. As in an acoustic wave resonator 320 of the second variation of the third embodiment in FIG. 8B, the side surfaces 62 of the dielectric films 60 and the side surfaces 72 of the dielectric film 70 may be located at positions at which the side surfaces 62 of the dielectric films 60 and the side surfaces 72 of the dielectric film 70 do not overlap in the direction perpendicular to the upper surface of the piezoelectric substrate 10. When the side surface 62 of the dielectric film 60 and the side surface 72 of the dielectric film 70 do not overlap in the direction perpendicular to the upper surface of the piezoelectric substrate 10, the acoustic wave excited by the electrode fingers 24 can be efficiently reflected.

Fourth Embodiment

Figure 9A:
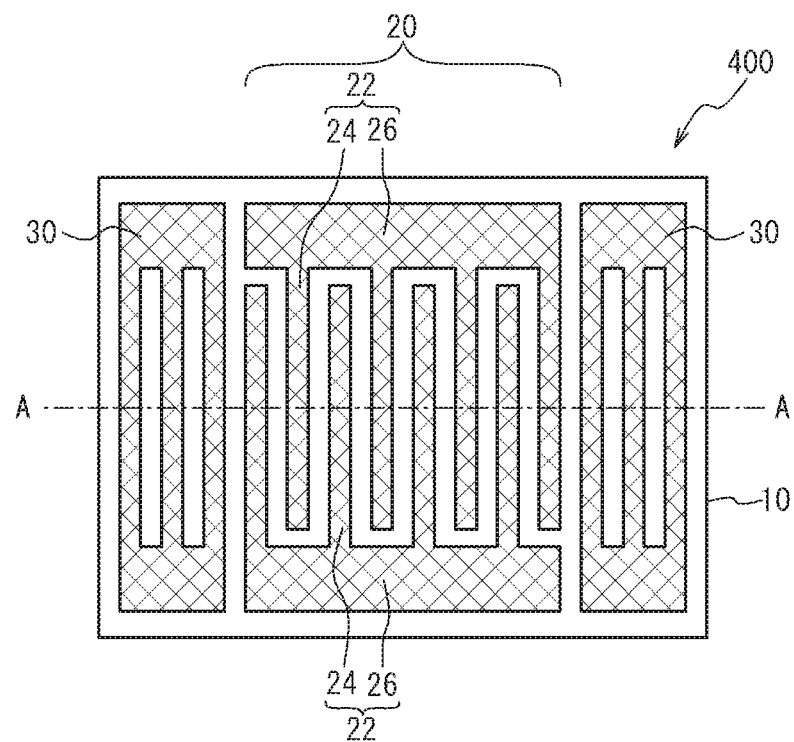
FIG. 9A is a plan view of an acoustic wave resonator in accordance with a fourth embodiment.
Figure 9B:
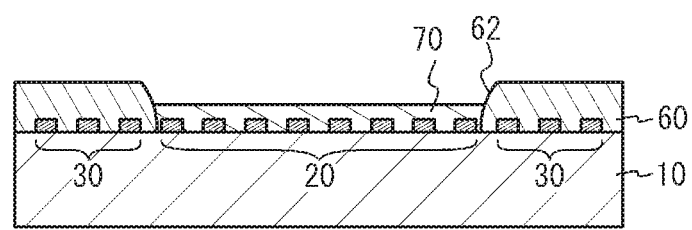
FIG. 9B is a cross-sectional view taken along line A-A in FIG. 9A.

FIG. 9A is a plan view of an acoustic wave resonator in accordance with a fourth embodiment, and FIG. 9B is a cross-sectional view taken along line A-A in FIG. 9A. As illustrated in FIG. 9A and FIG. 9B, in an acoustic wave resonator 400 of the fourth embodiment, the dielectric film 70 covers the IDT 20, but does not cover the dielectric films 60. The thickness of the dielectric film 60 is greater than the thickness of the dielectric film 70. Other structures are the same as those of the second embodiment, and the description thereof is thus omitted.

As in the fourth embodiment, the dielectric film 70 may not necessarily cover the dielectric films 60 as long as the dielectric film 70 is in contact with the side surfaces 62 of the dielectric films 60 and covers the IDT 20. In this case, since the reflection characteristics of the reflectors 30 improve because of mass load effect, the thickness of the dielectric film 60 is preferably greater than the thickness of the dielectric film 70.

Fifth Embodiment

Figure 10A:
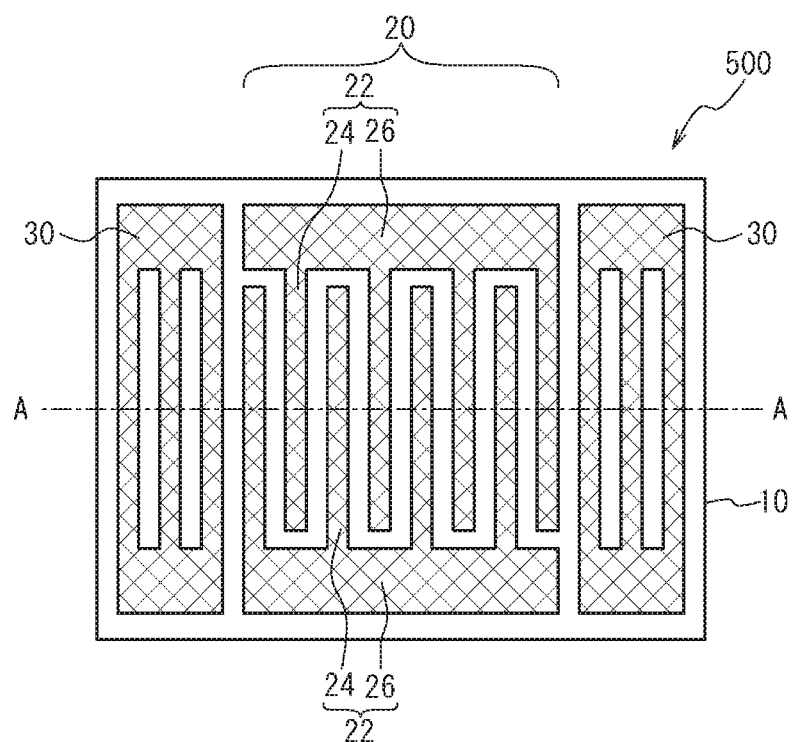
FIG. 10A is a plan view of an acoustic wave resonator in accordance with a fifth embodiment.
Figure 10B:
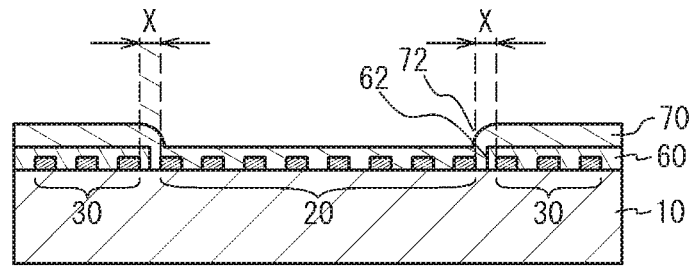
FIG. 10B is a cross-sectional view taken along line A-A in FIG. 10A.

FIG. 10A is a plan view of an acoustic wave resonator in accordance with a fifth embodiment, and FIG. 10B is a cross-sectional view taken along line A-A in FIG. 10A. As illustrated in FIG. 10A and FIG. 10B, in an acoustic wave resonator 500 of the fifth embodiment, the side surfaces 62 of the dielectric films 60 are substantially perpendicular to the upper surface of the piezoelectric substrate 10 and the arrangement direction of the electrode fingers 24. The dielectric films 60 having the above side surfaces 62 are formed by, for example, etching. Other structures are the same as those of the second embodiment, and the description thereof is thus omitted.

In the fifth embodiment, the side surfaces 62 of the dielectric films 60 are substantially perpendicular to the arrangement direction of the electrode fingers 24. This structure allows the acoustic wave excited by the electrode fingers 24 to be efficiently reflected.

In the second through fifth embodiments, the dielectric film 60 and the dielectric film 70 are made of different materials, but this does not intend to suggest any limitation. The dielectric film 60 and the dielectric film 70 may be made of the same material. Even when the dielectric film 60 and the dielectric film 70 are made of the same material, the acoustic wave excited by the electrode fingers 24 is reflected by the boundary face between the dielectric film 60 and the dielectric film 70.

Figure 11:
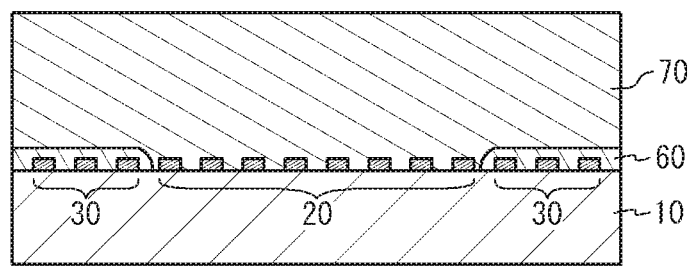
FIG. 11 is a cross-sectional view of a temperature compensation type surface acoustic wave resonator.

The first through fifth embodiments describe surface acoustic wave resonators as an example of the acoustic wave device, but the acoustic wave device may be a Love wave resonator or a boundary acoustic wave resonator. For example, as illustrated in FIG. 11, the acoustic wave device may be a temperature compensation type surface acoustic wave resonator using a thick silicon oxide film as the dielectric film 70.

Sixth Embodiment

Figure 12A:
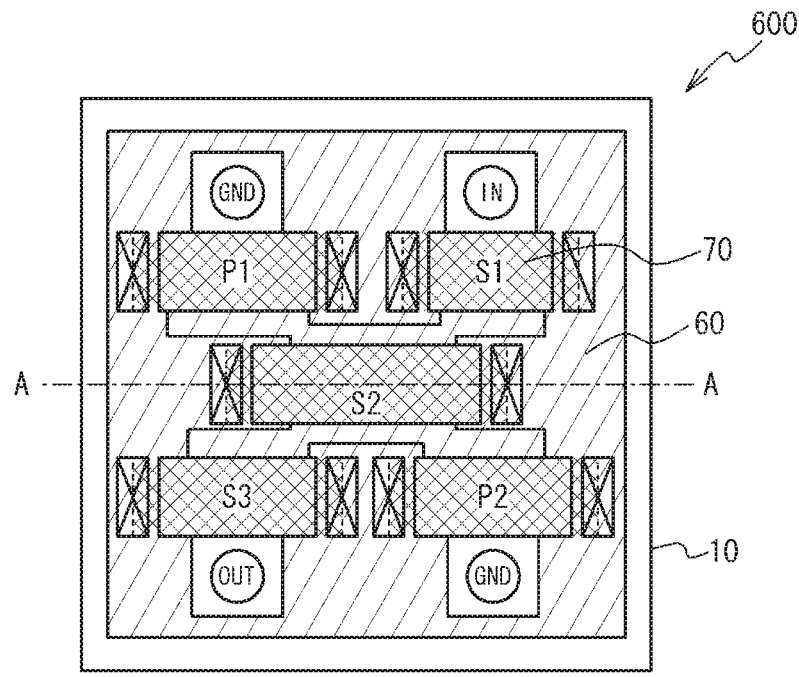
FIG. 12A is a plan view of a ladder-type filter in accordance with a sixth embodiment.
Figure 12B:
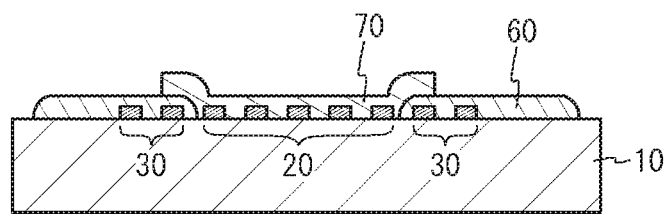
FIG. 12B is a cross-sectional view taken along line A-A in FIG. 12A.

FIG. 12A is a plan view of a ladder-type filter in accordance with a sixth embodiment, and FIG. 12B is a cross-sectional view taken along line A-A in FIG. 12A. As illustrated in FIG. 12A and FIG. 12B, a ladder-type filter 600 of the sixth embodiment includes one or more series resonators S1 through S3 and one or more parallel resonators P1 and P2 on the piezoelectric substrate 10. The series resonators S1 through S3 are connected in series between an input pad IN and an output pad OUT. The parallel resonators P1 and P2 are connected between wiring lines connecting the series resonators S1 through S3 and ground pads GND.

In each of the series resonators S1 through S3 and the parallel resonators P1 and P2, the dielectric film 60 covers the pair of reflectors 30, and the dielectric film 70 covers the IDT 20 and covers only the edge portions of the dielectric films 60. Since the dielectric film 70 covers the edge portions of the dielectric films 60, the moisture resistance is improved compared to the case where the side surfaces of the dielectric films 60 and 70 are in contact with each other as in the fourth embodiment. In addition, the dielectric film 60 is also located on the piezoelectric substrate 10 in the region in which no resonator is located excluding regions in which a pad is located. This structure also improves the moisture resistance.

Figure 13A:
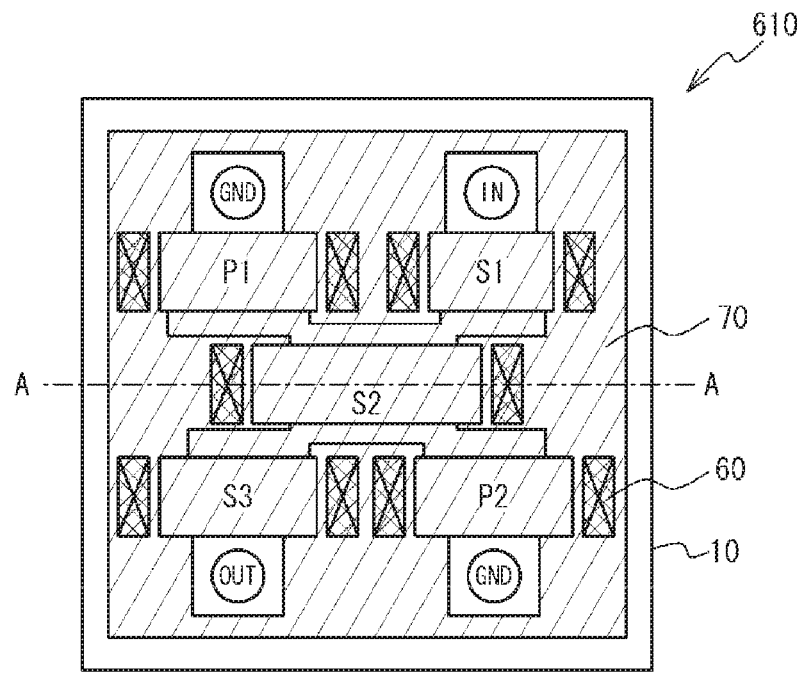
FIG. 13A is a plan view of a ladder-type filter in accordance with a first variation of the sixth embodiment.
Figure 13B:
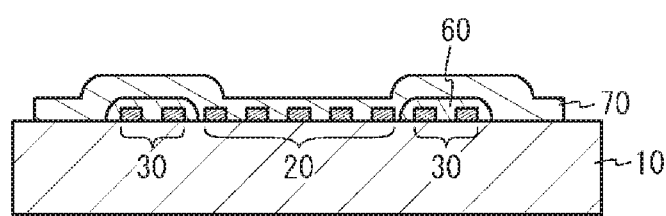
FIG. 13B is a cross-sectional view taken along line A-A in FIG. 13A.

FIG. 13A is a plan view of a ladder-type filter in accordance with a first variation of the sixth embodiment, and FIG. 13B is a cross-sectional view taken along line A-A in FIG. 13A. As illustrated in FIG. 13A and FIG. 13B, in a ladder-type filter 610 of the first variation of the sixth embodiment, the dielectric films 60 cover the pair of reflectors 30, and the dielectric film 70 covers the IDT 20 and the dielectric films 60 in each of the series resonators S1 through S3 and the parallel resonators P1 and P2. The dielectric film 70 is also located on the piezoelectric substrate 10 in the region in which no resonator is located excluding regions in which a pad is located. This structure improves the moisture resistance.

The series resonators S1 through S3 and the parallel resonators P1 and P2 are not limited to the above described acoustic wave resonators, and may be the acoustic wave resonator according to any one of the first through fifth embodiments.

Figure 14:
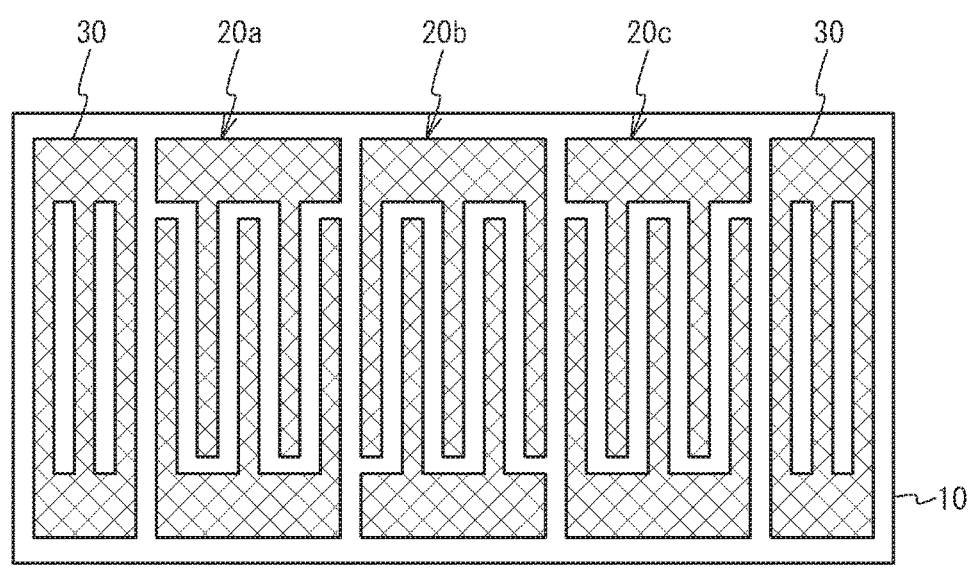
FIG. 14 is a plan view of a double-mode type surface acoustic wave filter.

The sixth embodiment describes a ladder-type filter as an example, but does not intend to suggest any limitation. For example, the filter may be other filters such as a double-mode type surface acoustic wave filter (DMS). FIG. 14 is a plan view of a double-mode type surface acoustic wave filter. As illustrated in FIG. 14, a double-mode type acoustic wave filter includes IDTs 20a through 20c arranged in the propagation direction of the acoustic wave, and the pair of reflectors 30 sandwiching the IDTs 20a through 20c all together.

Although the embodiments of the present invention have been described in detail, it is to be understood that the various change, substitutions, and alterations could be made hereto without departing from the spirit and scope of the invention.

What is claimed is:

1. An acoustic wave device comprising:
a piezoelectric substrate;
a comb-shaped electrode that is located on the piezoelectric substrate and that has a plurality of first electrode fingers;
a pair of reflectors that are located on the piezoelectric substrate and that have a plurality of second electrode fingers that are arranged in arrangement direction of the first electrode fingers of the comb-shaped electrode, the pair of reflectors sandwiching the comb-shaped electrode;
a first dielectric film located on the piezoelectric substrate, a thickness of the first dielectric being greater than a thickness of the pair of reflectors, the first dielectric film covering the pair of reflectors by entering between the plurality of second electrode fingers of the pair of reflectors and not covering the comb-shaped electrode, and the first dielectric film having side surfaces in regions between the comb-shaped electrode and the pair of reflectors; and
a second dielectric film located on the piezoelectric substrate, a thickness of the second dielectric film being greater than a thickness of the comb-shaped electrode, the second dielectric film covering the comb-shaped electrode by entering between the plurality of first electrode fingers of the comb-shaped electrode, and the second dielectric film being in contact with the side surfaces of the first dielectric film and covering at least a part of the side surfaces of the first dielectric film,
wherein an acoustic impedance of the first dielectric film is higher than an acoustic impedance of the second dielectric film.

2. The acoustic wave device according to claim 1, wherein the second dielectric film covers the comb-shaped electrode and the first dielectric film, and
a sum of thicknesses of the first dielectric film and the second dielectric film on the pair of reflectors is greater than a thickness of the second dielectric film on the comb-shaped electrode.

3. The acoustic wave device according to claim 2, wherein the second dielectric film has side surfaces between the comb-shaped electrode and the pair of reflectors.

4. The acoustic wave device according to claim 3, wherein the side surfaces of the second dielectric film are substantially perpendicular to an arrangement direction of electrode fingers of the comb-shaped electrode.

5. The acoustic wave device according to claim 3, wherein the side surfaces of the first dielectric film and the side surfaces of the second dielectric film are located at positions at which the side surfaces of the first dielectric film and the side surfaces of the second dielectric film do not overlap in a direction perpendicular to an upper surface of the piezoelectric substrate in a vertical direction.

6. The acoustic wave device according to claim 1, wherein the second dielectric film covers the comb-shaped electrode and does not cover the first dielectric film; and
a thickness of the first dielectric film is greater than a thickness of the second dielectric film.

7. The acoustic wave device according to claim 1, wherein the first dielectric film and the second dielectric film are made of different materials.

8. The acoustic wave device according to claim 1, wherein the side surfaces of the first dielectric film are substantially perpendicular to an arrangement direction of electrode fingers of the comb-shaped electrode.

9. The acoustic wave device according to claim 1, wherein the first dielectric film is an aluminum oxide film, a tantalum oxide film, a glass, a tellurium oxide film, a niobium oxide film, or a silicon nitride film, and the second dielectric film is a silicon oxide film or a fluorine-added silicon oxide film.

\* \* \* \* \*